US011863356B2

(12) United States Patent
Li et al.

(10) Patent No.: US 11,863,356 B2
(45) Date of Patent: Jan. 2, 2024

(54) ANALOG RECEIVER FRONT-END WITH VARIABLE GAIN AMPLIFIER EMBEDDED IN AN EQUALIZER STRUCTURE

(71) Applicant: QUALCOMM Incorporated, San Diego, CA (US)

(72) Inventors: Miao Li, San Diego, CA (US); Zhiqin Chen, San Diego, CA (US); Yu Song, San Diego, CA (US); Hongmei Liao, San Diego, CA (US); Zhi Zhu, San Diego, CA (US); Hao Liu, San Diego, CA (US); Lejie Lu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/589,782

(22) Filed: Jan. 31, 2022

(65) Prior Publication Data
US 2023/0246885 A1  Aug. 3, 2023

(51) Int. Cl.
*H04L 25/03* (2006.01)
(52) U.S. Cl.
CPC .. *H04L 25/03057* (2013.01); *H04L 25/03885* (2013.01)
(58) Field of Classification Search
CPC ............... H04L 25/026; H04L 25/0264; H04L 25/03006; H04L 25/03019;
(Continued)

(56) References Cited

U.S. PATENT DOCUMENTS

| 6,194,967 B1 | 2/2001 | Johnson et al. |
| 6,815,941 B2 | 11/2004 | Butler |

(Continued)

FOREIGN PATENT DOCUMENTS

GB  2533309 A  6/2016

OTHER PUBLICATIONS

Farjad-Rad R., et al., "0.622-8.0 Gbps 150mW Serial IO Macrocell with Fully Flexible Preemphasis and Equalization", 2003 Symposium on VLSI Circuits, Digest Technical Papers, Kyoto, Japan, Jun. 12, 2003, [Symposium on VLSI Circuits], New York, NY, IEEE, US, Jun. 2003 (Jun. 12, 2003), XP032413929, pp. 63-66, 10.1109/VLSIC.2003.1221162 ISBN: 978-4-89114-034-2 p. 63-p. 66, figures 1-6.

Talebbeydokhti N., et al., "Constant Transconductance Bias Circuit with an on-Chip Resistor", 2006 IEEE International Symposium on Circuits and Systems May 21-24, 2006 Island of KOS, Greece, IEEE—Piscataway, NJ, USA, May 21, 2006 (May 21, 2006), XP032458343, pp. 2857-2860, DOI: 10.1109/ISCAS.2006. 1693220 ISBN: 978-0-7803-9389-9 paragraph [0001]-paragraph [000V], figures 1-7.

(Continued)

*Primary Examiner* — Young T. Tse
(74) *Attorney, Agent, or Firm* — Loza & Loza, LLP

(57) ABSTRACT

A receiver has a first equalizer circuit that includes a first stage having a source degeneration circuit and a transimpedance amplifier (TIA). The source degeneration circuit includes a resistor coupled in parallel with a capacitor. The TIA includes an embedded variable gain amplifier with a gain controlled by feedback resistors. Each feedback resistor is coupled between input and output of the TIA. In some implementations, the receiving circuit has a second equalizer circuit coupled in series with the first equalizer circuit. The second equalizer circuit includes a first stage having a source degeneration circuit and a TIA. The source degeneration circuit in the second equalizer circuit has a source degeneration resistor coupled in parallel with a source degeneration capacitor and the TIA includes an embedded variable gain amplifier whose gain is controlled by feedback resistors coupled between input and output of the TIA in the second equalizer circuit.

27 Claims, 12 Drawing Sheets

(58) Field of Classification Search
CPC ......... H04L 25/03057; H04L 25/03878; H04L 25/03885
USPC ......... 375/229, 232, 349, 350; 708/322, 323
See application file for complete search history.

(56) References Cited

U.S. PATENT DOCUMENTS

| | | | |
|---|---|---|---|
| 7,633,346 B2 | 12/2009 | Oishi | |
| 8,200,179 B1 | 6/2012 | Mosinskis et al. | |
| 9,397,623 B1 | 7/2016 | Lacroix | |
| 10,263,815 B1* | 4/2019 | Geary | H04L 25/03885 |
| 10,613,570 B1 | 4/2020 | Codega et al. | |
| 2009/0224836 A1 | 9/2009 | Orberk et al. | |
| 2014/0193164 A1* | 7/2014 | Ide | H04B 10/6933 398/210 |
| 2018/0097139 A1* | 4/2018 | Li | H01L 25/041 |
| 2019/0081600 A1* | 3/2019 | Cevrero | H04B 10/6971 |
| 2019/0081604 A1 | 3/2019 | Thiagarajan et al. | |
| 2021/0175868 A1 | 6/2021 | Li et al. | |

OTHER PUBLICATIONS

Ali T., et al., "56/112Gbps Wireline Transceivers for Next Generation Data Centers on 7run FINFET CMOS Technology", 2021 IEEE Custom Integrated Circuits Conference (CICC), IEEE, Apr. 25, 2021, pp. 1-6, XP033915606, p. 1, right-hand col. line 14-p. 5, left-hand col. line 36, figures 1-11.
International Search Report and Written Opinion—PCT/US2023/010225—ISA/EPO—dated May 8, 2023.

* cited by examiner

*FIG. 4* -- Prior Art --

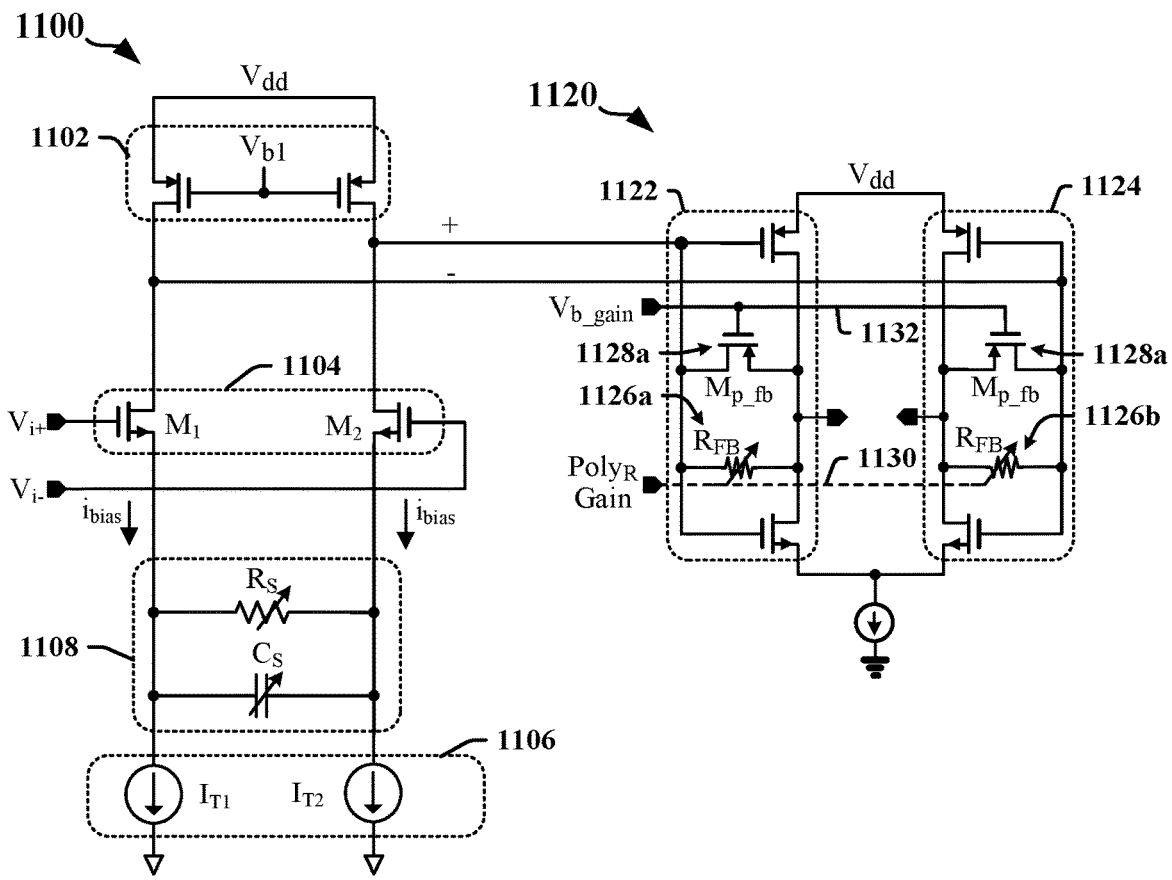
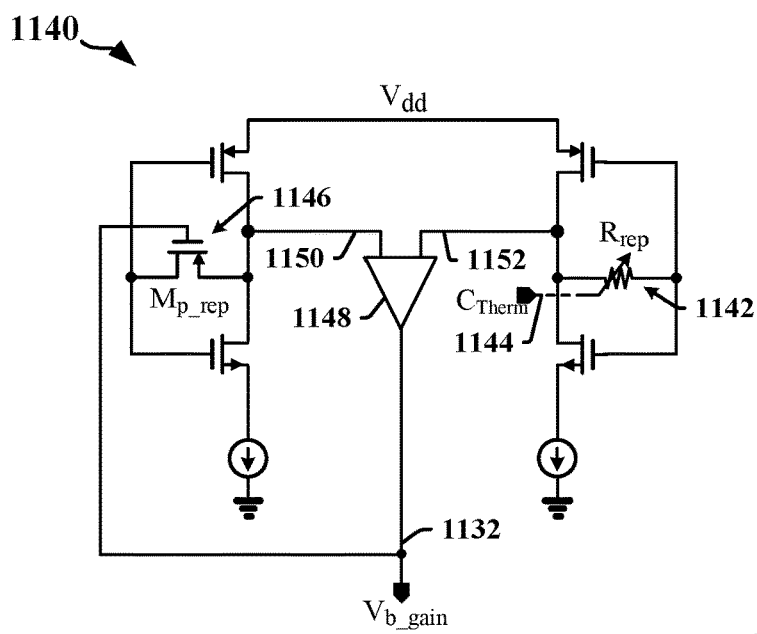
FIG. 11

ANALOG RECEIVER FRONT-END WITH VARIABLE GAIN AMPLIFIER EMBEDDED IN AN EQUALIZER STRUCTURE

TECHNICAL FIELD

The present disclosure generally relates to an amplification and equalization circuit and, more particularly, to circuitry for optimizing consistency of performance of the amplification and equalization circuit across a band of frequencies.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high speed bus interface for communication of signals between hardware components. For example, the high speed bus interface may be implemented using a Peripheral Component Interconnect Express (PCIe) bus. High frequency signals being communicated using the bus interface may experience attenuation. Therefore, an amplifier and equalizer at the receiver may be used to equalize and then amplify a signal received via the bus interface for processing.

SUMMARY

Certain aspects of the disclosure relate to systems, apparatus, methods and techniques for implementing and managing a high-frequency receiver that can reliably operate at high frequencies and can provide consistent performance across the operating bandwidth of the receiver.

In various aspects of the disclosure, a receiving circuit has a first equalizer circuit that includes a first stage having a source degeneration circuit and a trans-impedance amplifier (TIA). The source degeneration circuit includes a source degeneration resistor coupled in parallel with a source degeneration capacitor. The TIA includes an embedded variable gain amplifier that provides a gain that is controlled by feedback resistors. Each feedback resistor may be coupled between an input and an output of the TIA. In some implementations, the receiving circuit has a second equalizer circuit coupled in series with the first equalizer circuit. The second equalizer circuit includes a first stage having a source degeneration circuit and a TIA. The source degeneration circuit in the second equalizer circuit has a source degeneration resistor coupled in parallel with a source degeneration capacitor and the TIA includes an embedded variable gain amplifier that provides a gain that is controlled by feedback resistors, where each feedback resistor may be coupled between an input and an output of the TIA in the second equalizer circuit.

In various aspects of the disclosure, an apparatus includes means for means for equalizing a signal received from a communication channel, including a first equalizer circuit that includes a first stage having a source degeneration circuit configured to apply a first equalizing gain to the signal; means for applying a gain to the signal received from the communication channel, including a TIA in the first equalizer circuit; and means for selecting a gain to be applied to the signal received from the communication channel, including feedback resistors in the TIA that have configurable resistance values, each feedback resistor being coupled between an input of the TIA and an output of the TIA.

In various aspects of the disclosure, a method for equalizing a signal received from a communication channel includes providing the signal to a first stage of a first equalizer circuit, the first stage of the first equalizer circuit having a source degeneration circuit configured to apply a first equalizing gain to the signal, coupling an output of the first stage of the first equalizer circuit to a TIA in the first equalizer circuit, and configuring resistance values of feedback resistors in the TIA to select a gain to be applied to the output of the first stage of the first equalizer circuit, each feedback resistor being coupled between an input of the TIA and an output of the TIA.

In several aspects, a gain configured for the receiving circuit is provided as a combination of a first gain provided by the first equalizer circuit and a second gain provided by the second equalizer circuit. The gain configured for the receiving circuit may be expressed in a binary control input to the receiving circuit. The first gain may be configured based on even bits in the binary control signal and the second gain may be configured based on odd bits in the binary control signal. In some instances, the gain configured for the receiving circuit is expressed in a multi-digit word and the feedback resistors in each of the TIAs may be selected based on values of a number of bits in the multi-digit word.

In one example, the source degeneration circuit in the first equalizer circuit may be configured to equalize lower frequencies attenuation than the source degeneration circuit in the second equalizer circuit.

In certain examples, the TIA includes at least one feedback poly-resistor coupled in parallel with a P-channel metal-oxide-semiconductor (PMOS) resistor. The receiving circuit may further include a calibration TIA calibration and a feedback circuit. The TIA may receive a first input coupled to a first output through one or more configurable poly-resistors and a second input coupled to a second output through a PMOS transistor. The feedback circuit may be configured to control a voltage applied to a gate of the PMOS transistor such that channel resistance of the PMOS transistor matches a resistance provided by the one or more configurable poly-resistors. The resistance provided by the one or more configurable poly-resistors may be configured based on content of a multi-digit control word provided to the feedback circuit. The voltage applied to a gate of the PMOS transistor may be provided to a gate of the PMOS resistors in each TIA.

BRIEF DESCRIPTION OF THE DRAWINGS

FIG. 11 illustrates a CTLE that is configured in accordance with certain aspects of this disclosure.

DETAILED DESCRIPTION

Figure 1:
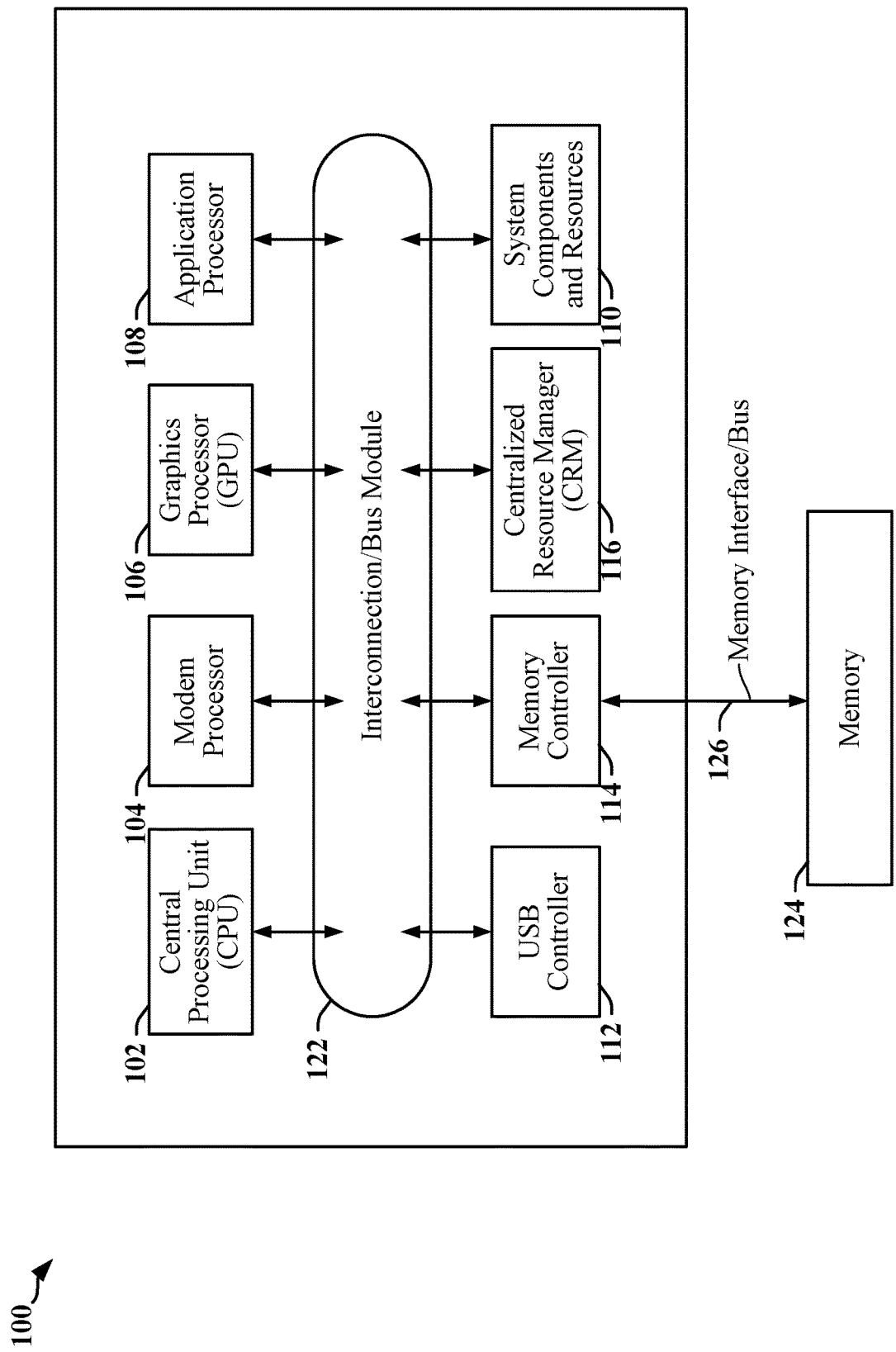
FIG. 1 illustrates an example of a system-on-a-chip (SOC) in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultra-books, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

Certain aspects of this disclosure relate to circuits used in a high-speed serializer-deserializer (SerDes). Circuits are described that can be deployed in the analog front-end (AFE) of a receiver. In one example, some aspects of the disclosure relate to equalizer circuits, which may be constructed with a trans-admittance stage (TAS) and trans-impedance amplifier (TIA). In another example, some aspects of the disclosure relate to equalizer circuits, which may be constructed with a trans-conductance stage (TCS) and a TIA. Some aspects relate to a variable-gain amplifier (VGA) that can be embedded within an equalizer TIA. Reductions in power consumption, improved consistency of frequency response across multiple gain settings and higher data rates can be accomplished using a continuous time linear equalizer (CTLE) configured in accordance with certain aspects of this disclosure. For example, certain aspects of this disclosure relate to a CTLE with a TCS-TIA structure that provides high-bandwidth and high-linearity using both poly-resistor and P-channel metal-oxide-semiconductor (PMOS) resistors in a VGA feedback resistor array embedded in a TIA.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
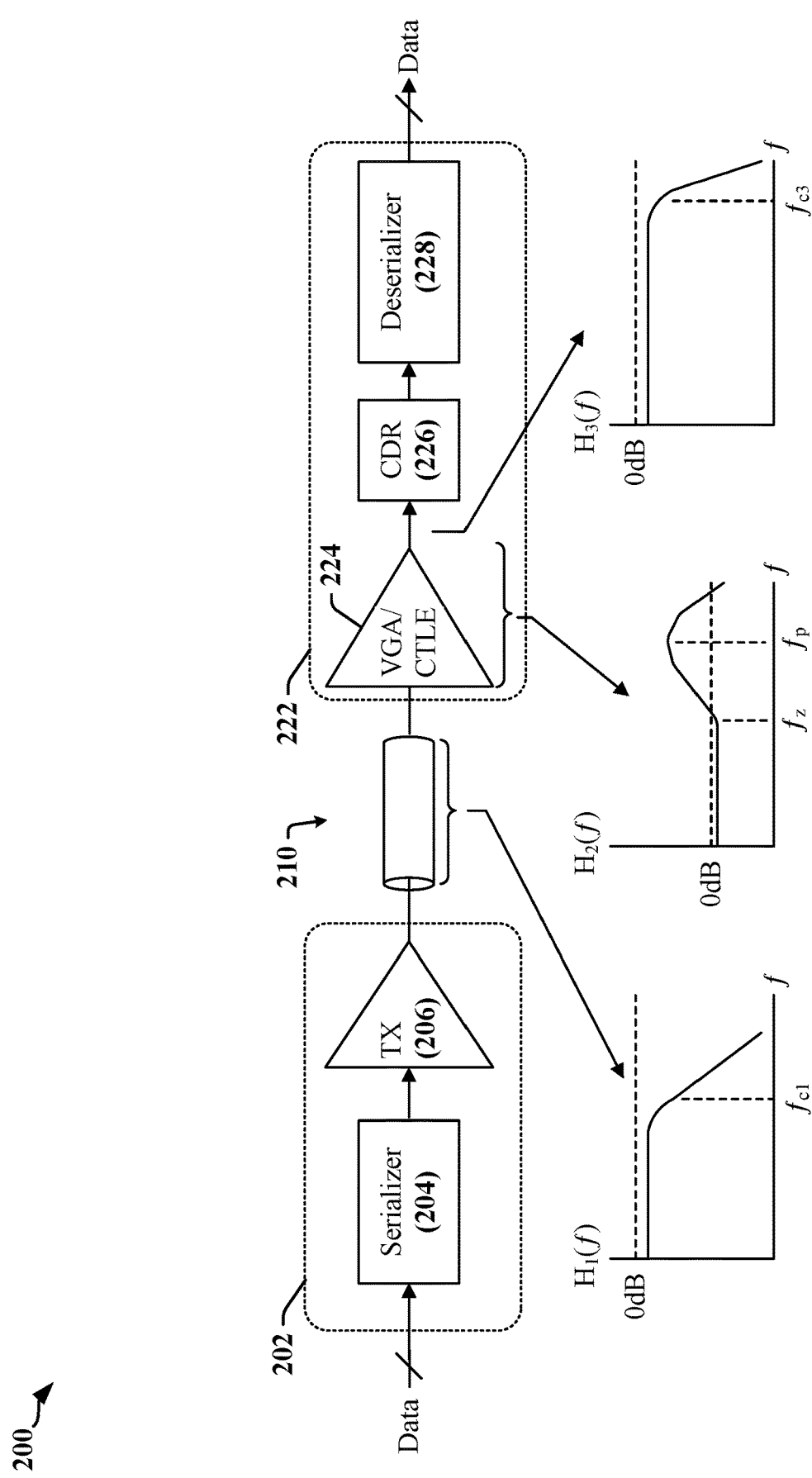
FIG. 2 illustrates an example of a data communication system that may be adapted in accordance with certain aspects of the present disclosure.

FIG. 2 illustrates an example of a data communication system 200 that may be adapted in accordance with certain aspects of the present disclosure. The data communication system 200 includes a transmitter 202, a data communication channel 210, and a receiver 222. The transmitter 202 may be provided in a first device that is configured to transmit a data signal to a second device. The data communication channel 210 provides a transmission medium through which the data signal propagates from the first device to the second device. The receiver 222 may be provided in the second device and may be configured to receive and process the data signal.

In one example, the transmitter 202 includes a serializer 204 configured to convert parallel data into serial data. The transmitter 202 further includes a transmit driver 206 configured to generate a data signal based on the serial data for transmission to the receiver 222 through the data communication channel 210.

The data communication channel 210 may be implemented using any type of transmission medium by which a data signal can propagate from the transmitter 202 to the receiver 222. Examples of the data communication channel 210 includes one or more metallization traces (which may include one or more vias) on a printed circuit board (PCB), stripline, microstrip, coaxial cable, twisted pair, etc.

In the illustrated example, the receiver 222 includes a variable gain amplifier (VGA) with a CTLE (referred to in combination as the VGA/CTLE 224), a clock data recovery circuit (the CDR 226), and a deserializer 228. CTLE may refer to techniques for boosting the higher frequency components of the signal at the receiver in order to bring all frequency components of the signal to a similar amplitude ratio before channel attenuation, improving jitter and eye-diagram performance. As disclosed herein, the VGA/CTLE 224 is configured to perform equalization and amplification of the received data signal. The CDR 226 is configured to recover a clock associated with the data signal and use the clock to recover the serial data from the data signal. The deserializer 228 is configured to convert the serial data back into parallel data.

The data communication channel 210 typically has a frequency response $H_1(f)$ that is similar to a low pass filter. For instance, the frequency response $H_1(f)$ has relatively low losses from direct current (DC) up to a particularly cutoff frequency $f_{c1}$; then the losses increase monotonically above the cutoff frequency $f_{c1}$. The frequency response $H_1(f)$ of the data communication channel 210 limits the data rate at which data may be sent through the channel. For example, the cutoff frequency $f_{c1}$ should be at least to the Nyquist rate of the data signal. If the Nyquist rate of the data signal is above the cutoff frequency $f_{c1}$, the data signal exhibits distortion at the receiver 222, which may be characterized as the eye in a signal eye diagram closing or getting smaller, making it difficult to recover the clock and the data by the CDR 226.

The VGA/CTLE 224 may perform equalization and amplification to increase the high frequency components of the data signal in order to increase the data rate at which the data signal may be sent through the data communication cable and reliably recovered at the receiver 222. For example, the VGA/CTLE 224 may be configured to provide a frequency response $H_2(f)$ that is substantially flat from DC up to a frequency $f_z$ corresponding to a Zero. Then, above the zero frequency $f_z$, the frequency response $H_2(f)$ of the VGA/CTLE 224 increases up to a frequency $f_p$ corresponding to a pole. Above the pole frequency $f_p$, the frequency response $H_2(f)$ of the VGA/CTLE 224 decreases monotonically. In some examples, the VGA/CTLE 224 may have more than one pole and one zero.

The VGA/CTLE 224 may be configured to have a frequency response $H_2(f)$ where the pole frequency $f_p$ substantially coincides with the cutoff frequency $f_{c1}$ of the frequency response $H_1(f)$ of the data communication channel 210. As the data communication channel 210 is cascaded with the VGA/CTLE 224, the frequency responses $H_1(f)$ and $H_2(f)$ of the data communication channel 210 and the VGA/CTLE 224 combine at the output of the VGA/CTLE 224 to form a composite frequency response $H_3(f)$. Thus, the high frequency boost at the pole frequency $f_p$ of the VGA/CTLE frequency response $H_2(f)$ compensates for the loss roll off at the cutoff frequency $f_{c1}$ of the channel frequency response $H_1(f)$ to generate the composite frequency response $H_3(f)$ having a cutoff frequency $f_{c3}$ much higher than the cutoff frequency $f_{c1}$ of the channel frequency response $H_1(f)$. Thus, through the use of the VGA/CTLE 224, much higher data rates between the transmitter 202 and receiver 222 may be realized.

Figure 3:
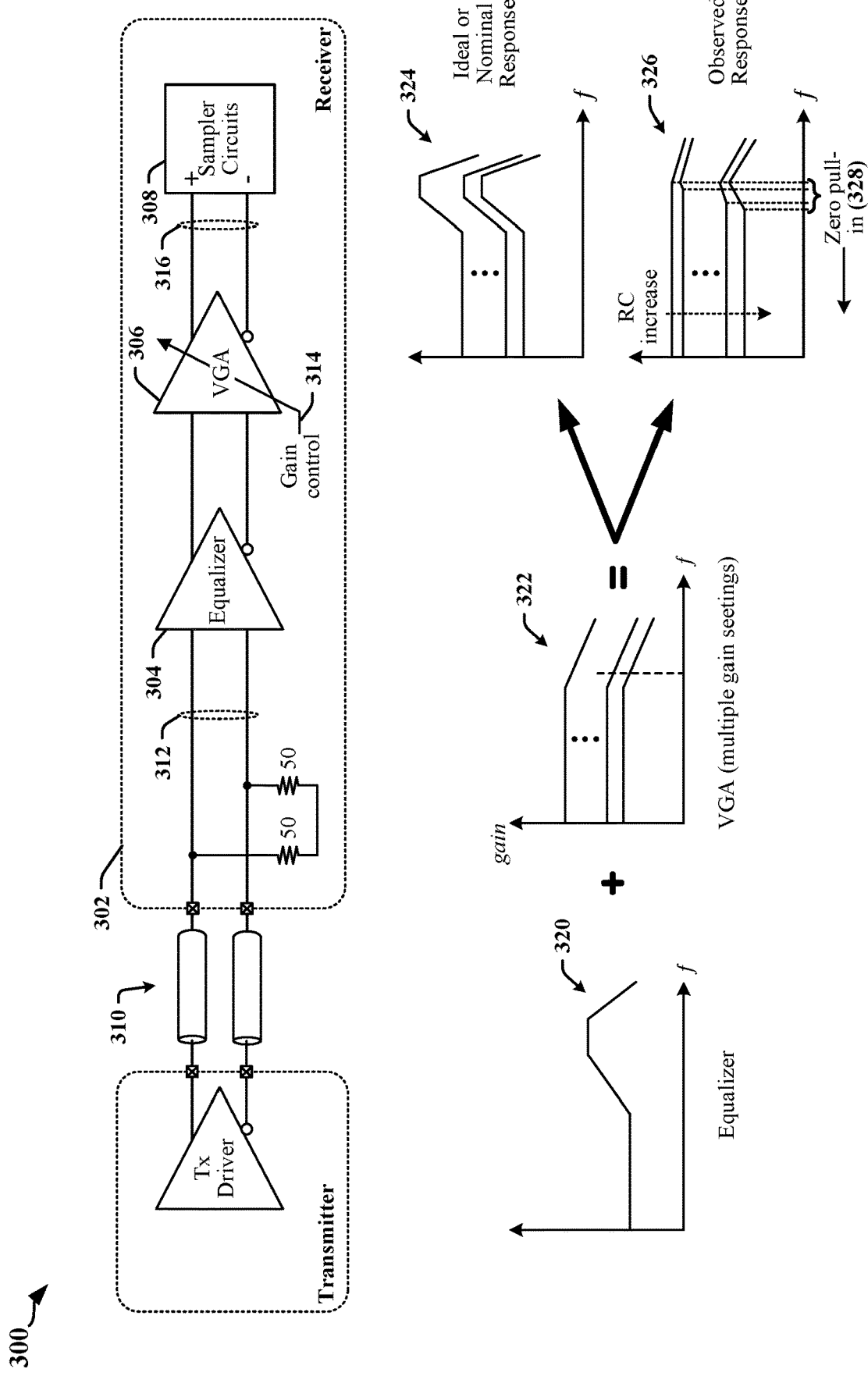
FIG. 3 illustrates certain aspects of a data communication interface that may be implemented in an SoC or in another IC device.

FIG. 3 illustrates certain aspects of a data communication interface 300 that may be implemented in an SoC or in another IC device. The receiver 302 in the data communication interface 300 includes differential signal processing circuits, including an equalizer 304 and a variable gain amplifier 306. The differential signal processing circuits can be configured to generate a differential output signal 316 by applying a frequency-dependent gain to a differential input signal 312, which is received from a differential communication channel 310 in the illustrated example. The differential output signal 316 may be provided to sampler circuits 308 configured to extract data and other information transmitted over the communication channel 310. In one example, the differential input signal 312 is applied to gate inputs or other control inputs of a pair of input transistors in the equalizer 304 and the output of the equalizer 304 is provided to the VGA 306. The gain of the VGA 306 is configurable through a gain control input 314. In one example, the gain control input 314 may include a 4-bit binary value that selects a gain setting from among 16 possible settings.

In the receiver 302, the VGA 306 cooperates with the equalizer 304 to equalize and amplify a small differential input signal 312 to a level that can be processed by a next stage. Ideally, the frequency response 320 of the equalizer 304 and the frequency response 322 of the VGA 306 produce an ideal combined frequency response 324 for each gain setting of the VGA 306. In the ideal situation the responses are substantially parallel for multiple gain settings in the combined frequency response 324. Parallel responses are indicative of consistent frequency response regardless of gain setting. A consistent equalization frequency response is typically desired regardless of the gain configured for the VGA 306. For example, the same equalization frequency response is typically desired for low amplitude signals and high amplitude signals, including when different gain settings are configured for the two signals.

In conventional systems, maintaining parallel responses for the different VGA gain settings can be very challenging. In many conventional systems, changes in VGA gain can affect equalizer pole/zero locations at high data rates. An observed combined frequency response 326 illustrates a loss of consistency between the different VGA gain settings that is indicated by a loss of parallelism at higher frequencies. In some instances, changes in the VGA 306 can affect the location of a parasitic-related Zero in the frequency response 326, in a manner referred to herein as "Zero pull-in" 328.

Figure 4:
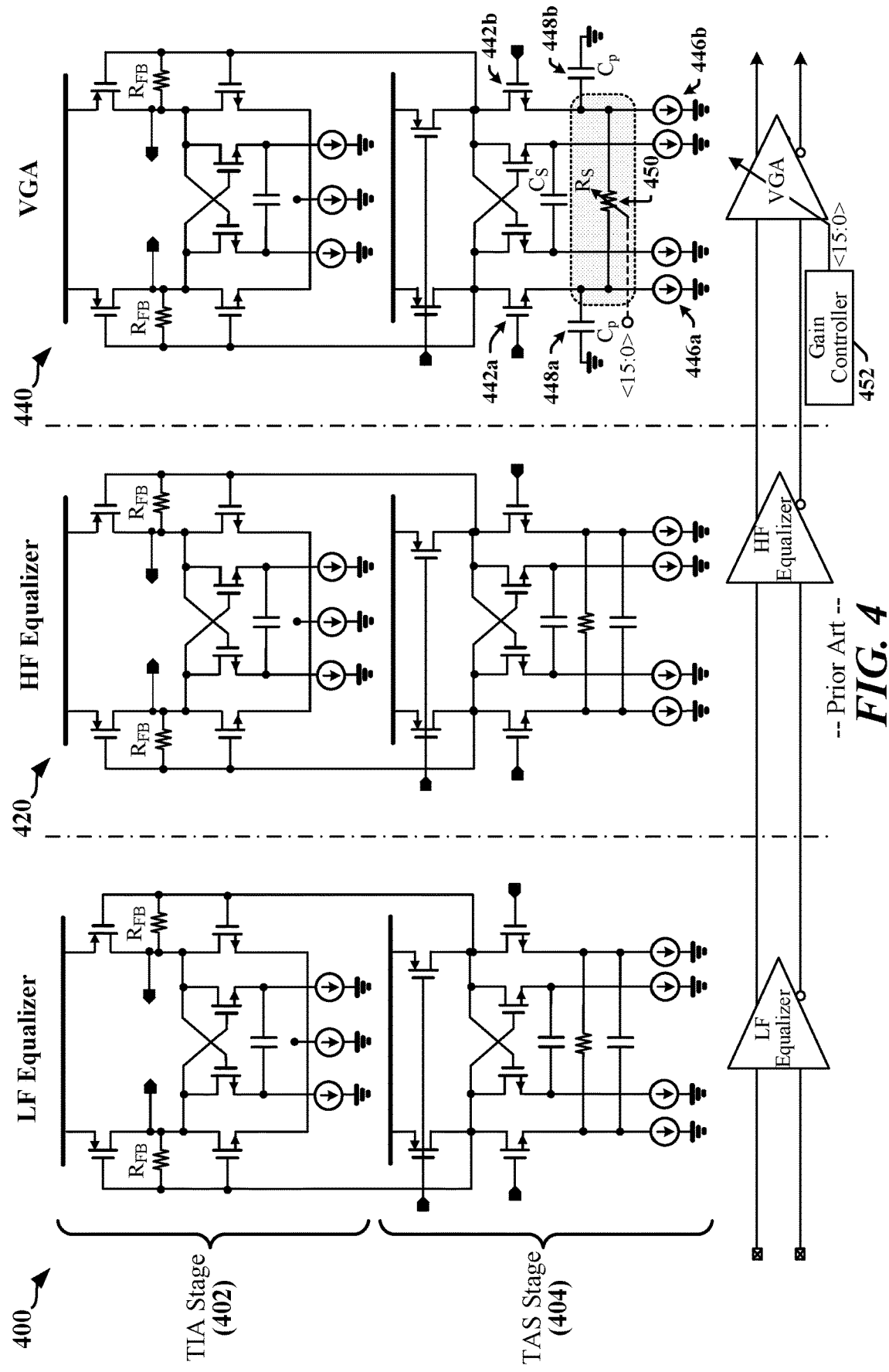
FIG. 4 illustrates the equalization and amplification stages in a conventional receiver.

FIG. 4 illustrates the equalization and amplification stages in a conventional receiver. Two-stage equalization is performed using a low-frequency stage (LF Equalizer 400) and a high-frequency stage (HF Equalizer 420). A VGA 440 includes a source-degenerated resistive structure, which is a commonly used VGA structure. The VGA 440 includes a pair of input transistors 442a, 442b (the gm pair) and corresponding tail circuits 446a, 446b. In some instances, the input transistors 442a, 442b may be formed as n-type metal-oxide-semiconductor field effect transistors (NMOS FETs). The VGA 440 further includes a source degeneration resistor 450 (generally a resistive device) between the sources of the input transistors 442a, 442b. The value of the source degeneration resistor 450 may be controlled by a gain controller circuit 452. In the illustrated example, the gain controller circuit 452 provides a 16-bit word that is used to select the resistance value of the source degeneration resistor 450 and thereby exercises control over the gain of the VGA 440. In various examples, the 16-bit word may be encoded using binary or unary encoding. Unary encoding, which may be referred to as thermometer encoding, represents data in the quantity of bits set to '1' that precede a terminating '0', or the quantity of bits set to '0' that precede a terminating '1'. Parasitic capacitance is represented by parasitic capacitors 448a, 448b ($C_p$) coupled to the sources of the input transistors 442a, 442b, respectively.

The differential pair transconductance GM may be stated as:

$$Gm = \left(\frac{gm}{1+gm*Rs}\right),$$

where gm represents the transconductance gain of the input transistors 442a, 442b and Rs represents the resistance of the source degeneration resistor 450. Absent the effect of the parasitic capacitors 448a, 448b, VGA gain can be linearly tuned by changing Rs. However, the capacitive contribution (Cs) at the sources of the input transistors 442a, 442b creates a Zero (Rs*Cs). When Rs is small, this Zero is not an issue since it is close to output Pole and is suppressed. When Rs increases, VGA high-frequency gain is boosted at Zero frequency due to Zero pull-in.

The LF Equalizer 400, HF Equalizer 420 and VGA 440 illustrated in FIG. 4 has a TIA 402 and a TAS 404. This TAS-TIA structure is widely used in equalizers and variable gain amplifiers where high data rates and/or long channels are used. For example, the TAS-TIA structure may be used in a PCIe interface that operates at 16 Gb/s, with a loss of −30 dB at 8 GHz or in a USB interface that operates at 20 Gb/s with a loss of −23 dB at 10 GHz. Multiple equalizer stages and VGA stages may be needed to counteract such large channel attenuations. The increased number of serial stages tends to induce greater direct current (DC) offset, bandwidth roll-off, and power consumption.

Figure 5:
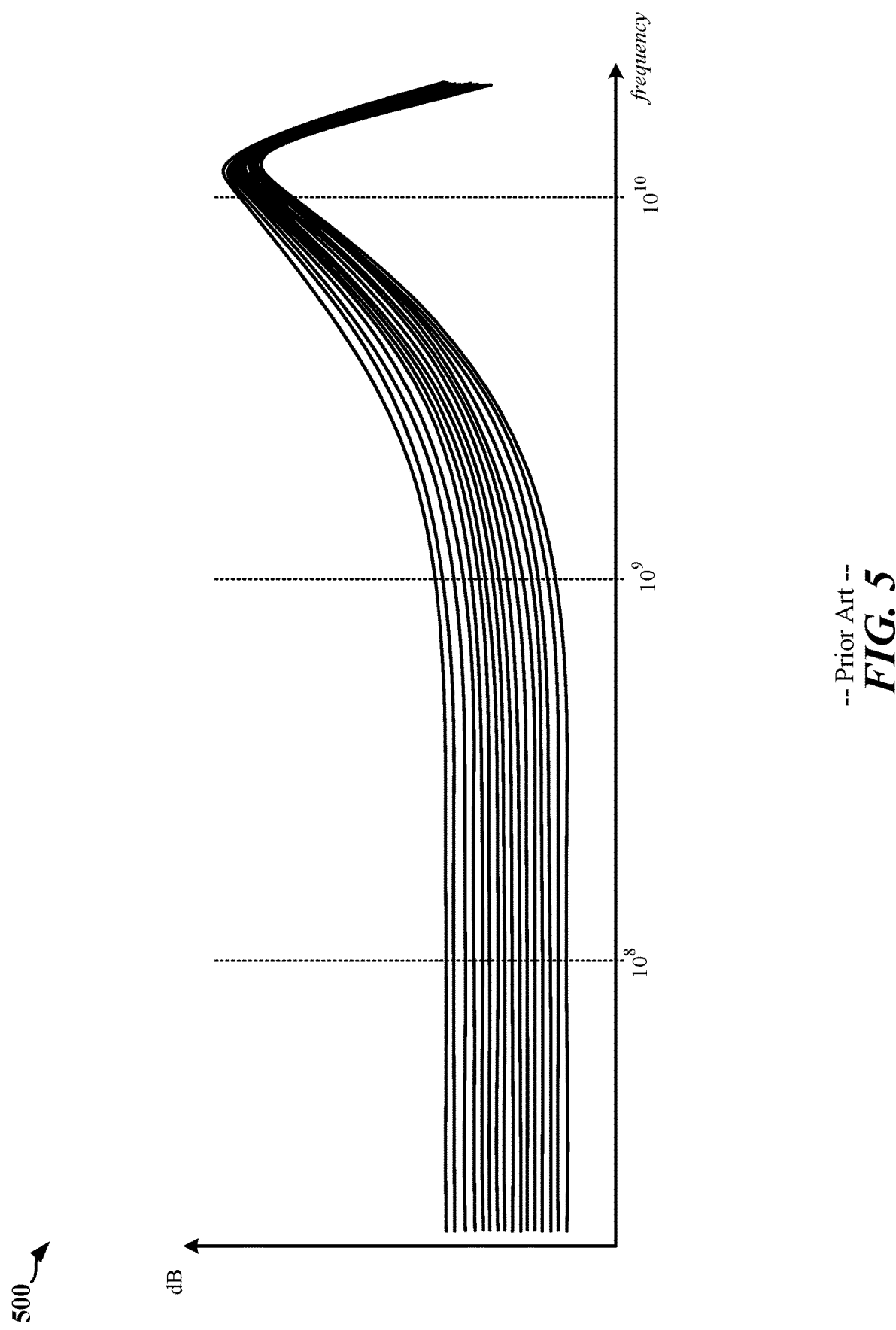
FIG. 5 includes a simulated characteristic for the equalization and amplification stages illustrated in FIG. 4.
Figure 6:
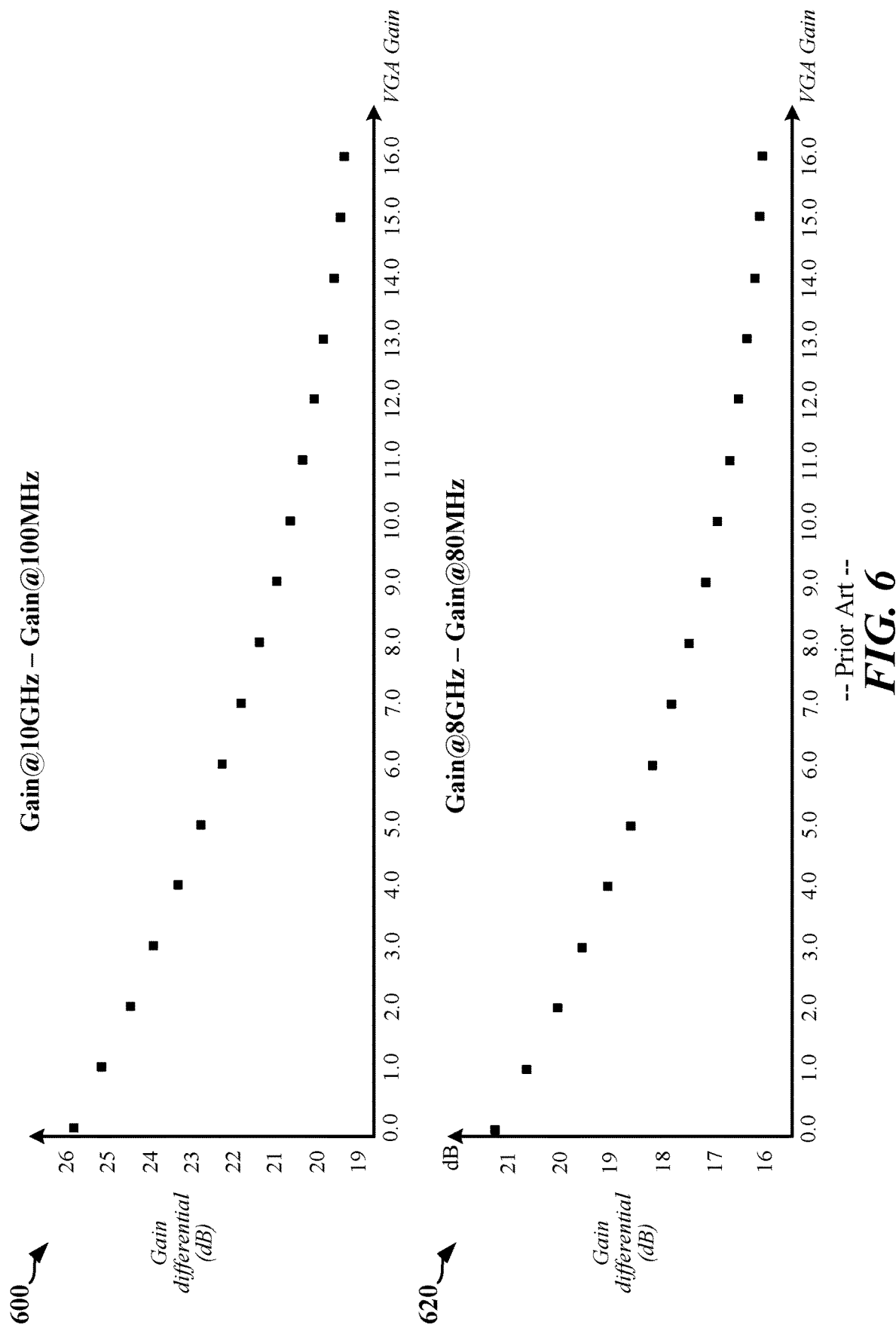
FIG. 6 includes graphical illustrations of gain differential between 10 GHz and 100 MHz and between 8 GHz and 80 MHz at each gain setting for the equalization and amplification stages illustrated in FIG. 4.

The presence of the RC Zero corresponding to the parasitic capacitors 448a, 448b and source degeneration resistor 450 can cause Zero pull-in, resulting in VGA gain curves that are not parallel. FIG. 5 includes a simulated characteristic 500 for the equalization and amplification stages illustrated in FIG. 4. The characteristic 500 assumes fixed equalizer gain while the VGA gain is tuned from 0 to 16. The gain curves for the 16 gain settings are not parallel with respect to one another, and Zero pull-in is exhibited. FIG. 6 includes a first graph 600 that shows gain differential between 10 GHz and 100 MHz at each gain setting for the equalization and amplification stages illustrated in FIG. 4. For example, at gain setting 12.0, the difference between gain obtained at 10 GHz and gain obtained at 100 MHz is approximately 20 dB. Gain differences over the 16 gain settings varies by approximately 6 dB. A second graph 620 in FIG. 6 shows gain differential between 8 GHz and 80 MHz at each gain setting for the equalization and amplification stages illustrated in FIG. 4. For example, at gain setting 4.0, the difference between gain obtained at 8 GHz and gain obtained at 80 MHz is approximately 19 dB. Gain differences over the 16 gain settings varies by approximately 5 dB.

Certain aspects of this disclosure provide a receiver circuit that can reduce the number of equalization and gain stages, limit the effect of parasitic capacitance on the output characteristic and distribute gain across multiple equalizer stages.

Figure 7:
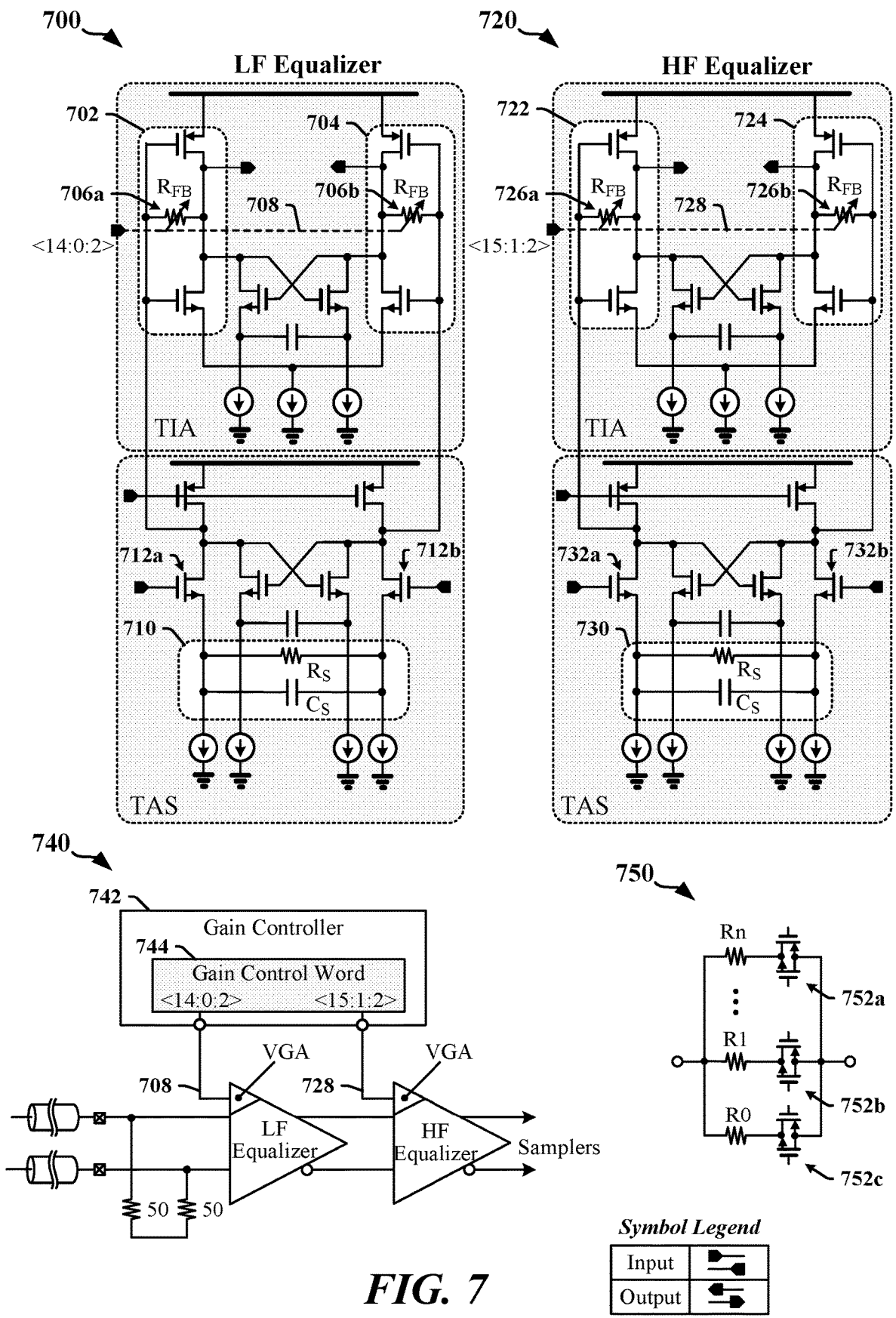
FIG. 7 Illustrates an equalizer that includes low-frequency and high-frequency equalizers equipped with embedded VGA circuits in accordance with certain aspects of the disclosure.

FIG. 7 illustrates an equalizer 700 that includes a low-frequency stage (LF Equalizer 700) and a high-frequency stage (HF Equalizer 720) that each include VGA circuits 702, 704, 722, 724 in accordance with certain aspects of this disclosure. The configuration of the LF Equalizer 700 and the HF Equalizer 720 is illustrated in the schematic drawing 740. Explicit VGA stages are removed from the configuration and replaced with VGA circuits 702, 704, 722, 724 that are embedded within the TIAs of the LF Equalizer 700 and the HF Equalizer 720. In the illustrated example, variable gain is obtained by controlling the resistance values of the feedback resistors 706a and 706b in the LF Equalizer 700 and the feedback resistors 726a and 726b in the HF Equalizer 720. The resistance values of the feedback resistors 706a and 706b in the LF Equalizer 700 are controlled using the even bits 708 of a gain control word 744. The feedback resistors 706a and 706b may be configured to have identical values, which may vary with gain setting defined by the gain control word 744. The resistance values of the feedback resistors 726a and 726b in the HF Equalizer 720 are controlled using the odd bits 728 of the gain control word 744. The feedback resistors 726a and 726b may be configured to have identical values for each gain setting defined by the gain control word 744. The provision of variable gain in the TIAs of the LF Equalizer 700 and the HF Equalizer 720 can implement the VGA function of the receiver with minimal or no additional power consumption.

In one aspect of the disclosure, the feedback resistors 706a, 706b, 726a and 726b can be implemented using circuits 750 that provide parallel resistor switching by small size complimentary transmission gates, such as transmission gates 752a, 752b, and 752c. Each of the feedback resistors 706a, 706b, 726a and 726b has a tunable resistance value ($R_{FB}$). VGA functionality is realized in the LF Equalizer 700 by tuning the corresponding the feedback resistors 706a, 706b. VGA functionality is realized in the HF Equalizer 720 by tuning the corresponding feedback resistors 726a, 726b.

In the illustrated example, a 16-bit gain control word 744 is provided to define a total gain to be applied in the receiver. In accordance with certain aspects of this disclosure, the bits of the gain control word 744 are inter-digitally distributed among equalizer stages. For example, even bits of the gain control word 744 may be used to control gain in the LF Equalizer 700, and odd bits of the gain control word 744 may be used to control gain in the HF Equalizer 720. In some instances, the 16-bit gain control word 744 is provided by a gain controller 742 and may be dynamically configured through feedback or calibration. The distribution of gain between the LF Equalizer 700 and the HF Equalizer 720 can produce gain curves that vary smoothly and maintain parallelism.

In one aspect of the disclosure, Zero pull-in can be minimized or eliminated when the VGA functionality is embedded in the TAS-TIA structures of the LF Equalizer 700 and the HF Equalizer 720. Frequency equalization is obtained through variable TAS-TIA equalizer gain that is provided through the source degeneration circuits 710 and 730 of the LF Equalizer 700 and the HF Equalizer 720, respectively. The source degeneration circuits 710 and 730 each include a source degeneration resistor $R_S$ (generally a resistive device) coupled in parallel with a source degeneration capacitor $C_S$ (generally a capacitive device) between the sources of the input transistors 712a, 712b or 732a, 732b. The equalizer gain ($G_{EQ}$) may be calculated as $G_{EQ}=G_m \times Z_{out}$, where Gm represents the source-degenerated transconductance and $Z_{out}$ represents output impedance. Output impedance is proportional to TIA feedback resistance, $R_{FB}$. Tuning $R_{FB}$ may linearly change the equalizer/VGA combination gain curves. Output parasitic capacitance is included in the output pole, and does not introduce any obvious Zeros. Post-layout simulation has shown gain curves parallel to each other in a large frequency span.

Figure 8:
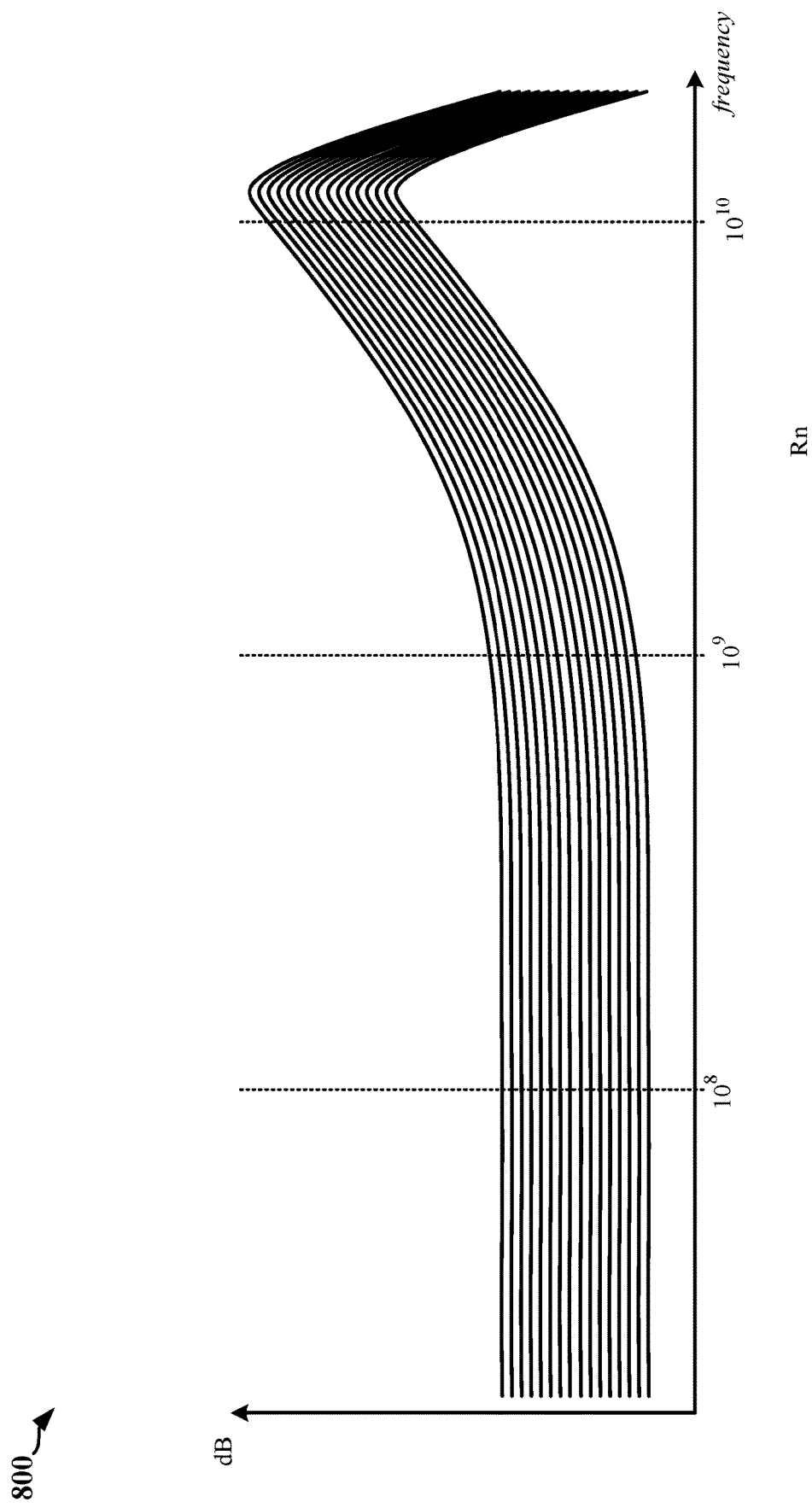
FIG. 8 includes a simulated characteristic for the equalization stages illustrated in FIG. 7.

FIG. 8 includes a simulated characteristic 800 for the equalization stages illustrated in FIG. 7. The characteristic 800 is based on a VGA gain that is tuned from 0 to 16. The gain curves for the 16 gain settings are substantially parallel with respect to one another. Zero pull-in is not exhibited.

Figure 9:
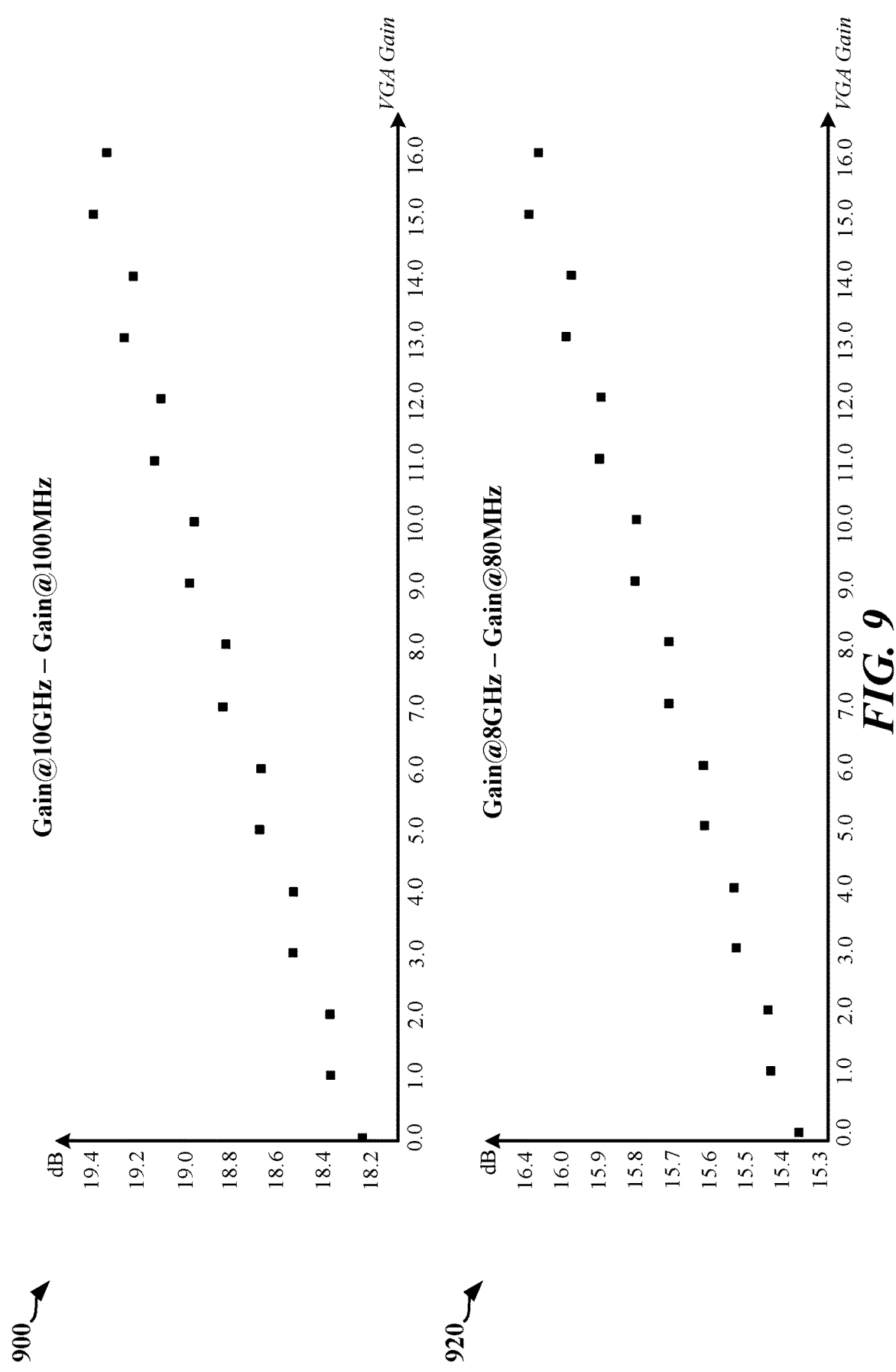
FIG. 9 includes graphical illustrations of gain differential between 10 GHz and 100 MHz and between 8 GHz and 80 MHz at each gain setting for the combined equalization stages illustrated in FIG. 7.

FIG. 9 includes a first graph 900 that shows gain differential between 10 GHz and 100 MHz at each gain setting for the combined equalization stages illustrated in FIG. 7. For example, at gain setting 14.0, the difference between gain obtained at 10 GHz and gain obtained at 100 MHz is approximately 19.2 dB. Gain differences over the 16 gain settings varies by approximately 1 dB. A second graph 920 in FIG. 9 shows gain differential between 8 GHz and 80 MHz at each gain setting for the combined equalization stages illustrated in FIG. 7. For example, at gain setting 10.0, the difference between gain obtained at 8 GHz and gain obtained at 80 MHz is approximately 15.8 dB. Gain differences over the 16 gain settings varies by approximately 1 dB.

Figure 10:
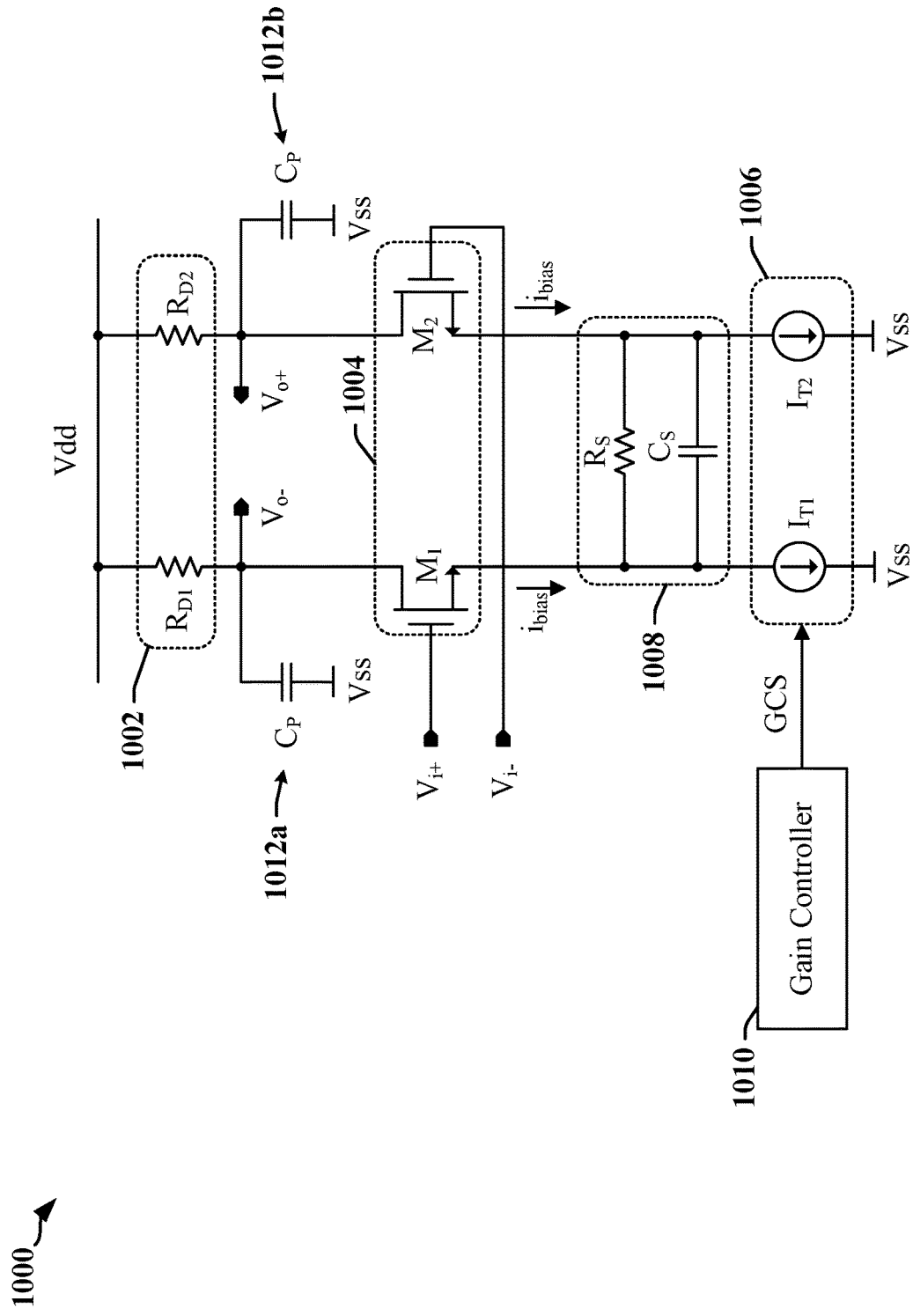
FIG. 10 illustrates an example of a VGA with embedded equalization that may be configured or adapted for use in accordance with certain aspects of the present disclosure.

Certain aspects of this disclosure may be applicable to a CTLE that is formed by cascading a transconductance stage (TCS or Gm) and TIA. CTLEs that include the Grp-TIA structure are widely used in ultra-high speed serial link design to increase the bandwidth. In some examples, high-speed amplifiers are implemented using a current-mode-logic (CIVIL) structure that operates as a TCS or Gm amplifier. FIG. 10 illustrates an example of a VGA 1000 with embedded equalization that may be configured or adapted for use in accordance with certain aspects of the present disclosure. The VGA 1000 may also be characterized as a CTLE with embedded gain control.

The VGA 1000 includes load resistors 1002, a pair of input transistors 1004 (the gm pair) and corresponding tail circuits 1006. A first load resistor $R_{D1}$, a first input transistor $M_1$ and a first tail current source $I_{T1}$ may be coupled in series between an upper voltage rail Vdd and a lower voltage rail Vss. A second load resistor $R_{D2}$, a second input transistor $M_2$ and a second tail current source $I_{T2}$ are coupled in series between the upper voltage rail Vdd and the lower voltage rail Vss. The load resistors 1002 may be implemented as resistive devices. The pair of input transistors 1004 may be formed as N-channel metal-oxide-semiconductor field effect transistors (NMOS FETs). The VGA 1000 further includes load capacitors $C_p$ 1012a, 1012b coupled between the drains of the input transistors $M_1$ and $M_2$ and the lower voltage rail Vss, respectively. The load capacitors $C_p$ 1012a, 1012b may represent parasitic capacitance and/or capacitive devices.

The VGA 1000 further includes a source degeneration circuit 1008 that provides frequency equalization. The source degeneration circuit 1008 includes a source degeneration resistor $R_S$ (generally a resistive device) coupled in parallel with a source degeneration capacitor $C_S$ (generally a capacitive device) between the sources of the input transistors $M_1$ and $M_2$. The general transfer function of the VGA 1000 may be stated as:

$$H(s) = \frac{g}{C_p} \times \frac{s + \frac{1}{R_S C_S}}{\left(s + \frac{1 + g_m R_S/2}{R_S C_S}\right)\left(s + \frac{1}{R_D C_p}\right)}.$$

In the illustrated example, the VGA 1000 includes a gain controller 1010 configured to generate a gain control signal (GCS) for controlling the amount of bias current $I_{bias}$ that the tail current sources $I_{T1}$ and $I_{T2}$ sink, respectively. The gain of the VGA 1000 may be directly related (in the same direction) to the bias current $I_{bias}$. Thus, the gain controller 1010 can be configured to control the gain of the VGA 1000 by controlling the bias current $I_{bias}$ of the tail current sources $I_{T1}$ and $I_{T2}$ via the gain control signal (GCS).

Conventional CTLEs that include the $G_m$-TIA structure may suffer from non-linearity and may be unable to support higher bandwidths needed by increasingly complex devices that drive a demand for increased data rates. The VGA in certain conventional CTLEs is implemented using a feedback circuit in which a TIA feedback resistor is implemented using a feedback resistor array controlled by a binary or thermometer coded word. A feedback resistor array controlled by a binary coded word can help reduce parasitic resistance in comparison to a feedback resistor array controlled by a thermometer coded word. A feedback resistor array controlled by a binary coded word may be more susceptible to glitch and monotonicity issues, including when a CTLE adaptation algorithm is applied to configure the feedback resistor array.

A feedback resistor array controlled by a thermometer coded word can improve monotonicity and linearity but may have a limited bandwidth. Bandwidth may be significantly reduced with respect to a CTLE that uses a feedback resistor array controlled by a binary coded word when the feedback resistor array is affected by large parasitic resistance and capacitance and is located on critical data path. Some conventional CTLEs are provided with a cascaded additional inductor, in series with the feedback resistor array, to boost the bandwidth. The addition of an inductor can significantly increase the area consumed in an SoC or another IC device.

Certain aspects of this disclosure relate to a CTLE with a $G_m$-TIA structure that provides high-bandwidth and high-linearity. In one aspect, a VGA embedded in a TIA includes resistors fabricated using a thin film of polysilicon and resistors that utilize the channel resistance of PMOS transistors in the TIA feedback resistor array. The resistors fabricated using a thin film of polysilicon may be referred to as poly-resistors herein and the resistors that utilize the channel resistance of PMOS transistors may be referred to as PMOS resistors herein. The poly-resistors in the TIA feedback resistor array may be controlled by binary code, while the PMOS resistor is controlled by PMOS gate voltage generated from a thermometer coded replica circuit. The thermometer coded PMOS resistor helps to prevent non-monotonicity during the gain adaptation, and undesired glitch due to switch on/off. The binary coded poly-resistor can reduce the parasitic load on critical data paths. The binary coded poly-resistor can promote or enable an increase in TIA linearity when the total resistance of the resultant feedback resistor array is dominated by poly-resistors.

FIG. 11 illustrates a CTLE that is configured in accordance with certain aspects of this disclosure. The CTLE includes a $G_m$ stage 1100 and a TIA 1120. The $G_m$ stage 1100 includes a load 1102, a pair of input transistors 1104 (the gm pair) and corresponding tail circuits 1106. The $G_m$ stage 1100 further includes a source degeneration circuit 1108 that provides frequency equalization. The source degeneration circuit 1108 includes a source degeneration resistor $R_S$ (generally a resistive device) coupled in parallel with a source degeneration capacitor $C_S$ (generally a capacitive device) between the sources of the input transistors $M_1$ and $M_2$. The source degeneration circuit 1108 controls equalization strength.

The TIA 1120 includes embedded VGA circuits 1122, 1124. In the illustrated example, variable gain is obtained by controlling the resistance provided by a combination of feedback resistor arrays 1126a, 1126b and corresponding PMOS resistors 1128a, 1128b. Each feedback resistor array 1126a, 1126b includes two or more poly-resistors and the resistance values of the feedback resistor arrays 1126a, 1126b may be controlled by paralleling one or more of the poly-resistors based on the value of a binary-encoded poly-resistor gain-control word 1130. The use of binary encoding to provide the poly-resistor gain-control word 1130 can reduce the effect of parasitic load. The feedback resistor arrays 1126a, 1126b may be configured to have identical resistance values for each gain setting defined by the poly-resistor gain-control word 1130.

The resistance values of the PMOS resistors 1128a and 1128b may be controlled using a gate control signal 1132 ($V_{b\_gain}$) with a voltage that is generated based on the value of a thermometer-encoded gain-control word. The gate control signal 1132 is generated by a calibration circuit 1140 that may replicate certain aspects of the TIA circuits that include PMOS resistors. A thermometer code 1144 configures the resistance value of the poly-resistor 1142 ($R_{rep}$) and, through the action of a feedback circuit, the PMOS transistor 1146 ($M_{p\_rep}$) mimics the resistance of the poly-resistor 1142. The gate voltage of $M_{p\_fb}$ is replicated in the gate control signal 1132 provided to the TIA 1120. The feedback circuit may include a differential voltage comparator 1148 that compares the magnitudes of voltages 1150 and 1152 produced under the effects of the PMOS transistor 1146 and poly-resistor 1142 respectively. The output of the differential voltage comparator 1148 tends to pull the voltage 1150 produced under the effect of the PMOS transistor 1146 toward the voltage 1152 produced under the effect of the poly-resistor 1142.

The feedback resistance in the TIA 1120 controls the overall gain of the CTLE. According to one aspect, the feedback resistance in the TIA 1120 is the result of paralleling one or more poly-resistors in the corresponding feedback resistor array 1126a, 1126b and the corresponding PMOS resistor 1128a or 1128b.

According to one aspect, high linearity of the CTLE may be maintained when the resistance provided by a combination of feedback resistor arrays 1126a, 1126b and corresponding PMOS resistors 1128a, 1128b is dominated by the poly-resistors in the feedback resistor arrays 1126a, 1126b. In one example, a larger value may be configured for the PMOS resistor 1128a or 1128b "ON" resistance than for the feedback resistor arrays 1126a, 1126b.

Figure 12:
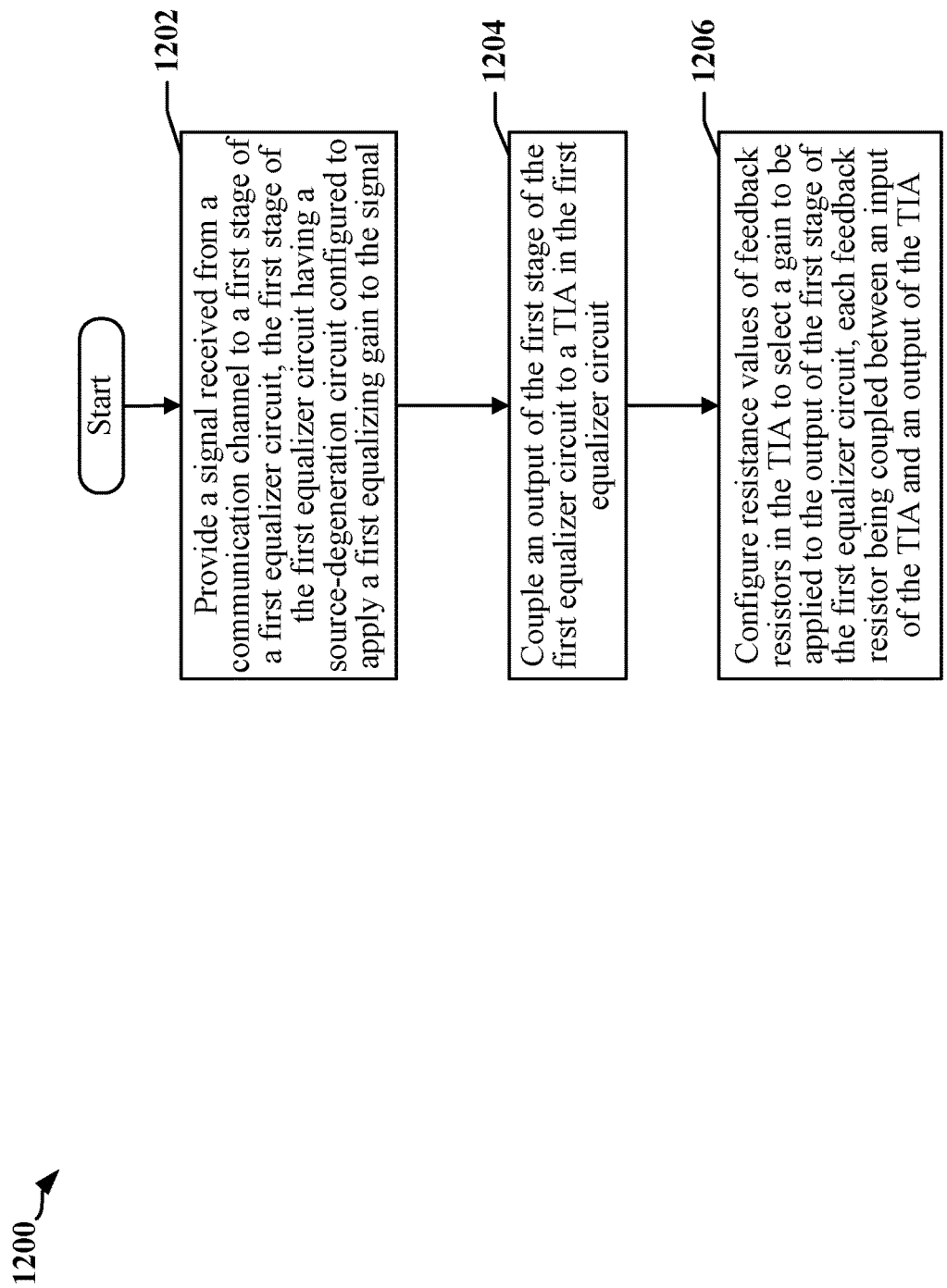
FIG. 12 is a flow diagram illustrating an example of a method for equalizing a signal received from a communication channel in accordance with certain aspects of the present disclosure.

FIG. 12 is a flow diagram illustrating an example of a method 1200 for equalizing a signal received from a communication channel in accordance with certain aspects of the present disclosure. The receiver may include the equalizers illustrated in FIGS. 7 and 11.

At block 1202, the signal is provided to a first stage of a first equalizer circuit, the first stage of the first equalizer circuit having a source degeneration circuit configured to apply a first equalizing gain to the signal. At block 1204, an output of the first stage of the first equalizer circuit is coupled to a TIA in the first equalizer circuit. At block 1206, resistance values of feedback resistors in the TIA are configured to select a gain to be applied to the output of the first stage of the first equalizer circuit, each feedback resistor being coupled between an input of the TIA and an output of the TIA.

In certain examples, an output of the first equalizer circuit may be coupled to a first stage of a second equalizer circuit. The first stage of the second equalizer circuit may have a source degeneration circuit configured to apply a second equalizing gain to the output of the first equalizer circuit. An output of the first stage of the second equalizer circuit may be coupled to a TIA in the second equalizer circuit. Resistance values of feedback resistors in the TIA in the second equalizer circuit may be configured to select a gain to be applied to the output of the first stage of the second equalizer circuit. Each feedback resistor may be coupled between an input and an output of the TIA in the second equalizer circuit.

A gain configured for the receiving circuit may be implemented or provided as a combination of a first gain provided by the first equalizer circuit and a second gain provided by the second equalizer circuit. In one example, the resistance values of the feedback resistors in the TIA in the first equalizer circuit may be configured using even bits in a binary control signal and the resistance values of the feedback resistors in the TIA in the second equalizer circuit may be configured using odd bits in the binary control signal. In one example, the resistance values of the feedback resistors in each TIA may be selected based on values of a number of bits in a multi-digit word.

The source degeneration circuit in the first equalizer circuit may be configured to equalize a first band of frequencies and the source degeneration circuit in the second equalizer circuit may be configured to equalize a second band of frequencies different from the first band of frequencies.

In certain examples, a TIA comprises at least one feedback poly-resistor coupled in parallel with a PMOS resistor. A feedback circuit in a calibration TIA may be used to match a resistance of the at least one feedback poly-resistor to a channel resistance of a PMOS transistor. A gate control signal applied to the PMOS transistor may be coupled to a gate of the PMOS resistor. The gate control signal may produce a comparable or identical channel resistance in the PMOS resistor.

The operational steps described in any of the exemplary aspects herein are described to provide a subset of examples of possible implementations. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. In certain aspects, means for equalizing a signal received from a communication channel may include the LF Equalizer 700 and HF Equalizer 720 illustrated in FIG. 7. Furthermore, means for applying a gain to the signal received from the communication channel may include the VGA circuits 702, 704, 722, 724 that are embedded within the TIAs of the LF Equalizer 700 and the HF Equalizer 720. The means for selecting a gain to be applied to the signal received from the communication channel, may include the feedback resistors 706a, 706b, 726a, 726b in the TIAs of the LF Equalizer 700 and the HF Equalizer 720, when the feedback resistors 706a, 706b, 726a, 726b have configurable resistance values.

In one example, a receiving circuit provided in accordance with certain aspects of this disclosure has a first equalizer circuit. The first equalizer circuit may include a first stage and a TIA. The first stage may have a source degeneration circuit that includes a source degeneration resistor coupled in parallel with a source degeneration capacitor. The TIA may include feedback resistors. Each feedback resistor may be coupled between an input and an output of the TIA. The receiving circuit may further have a second equalizer circuit coupled in series with the first equalizer circuit. The second equalizer circuit may have a first stage and a TIA. The first stage may have a source degeneration circuit that includes a source degeneration resistor coupled in parallel with a source degeneration capacitor. The TIA may include feedback resistors. Each feedback resistor may be coupled between an input and an output of the TIA in the second equalizer circuit.

In some examples, a gain configured for the receiving circuit is provided as a combination of a first gain provided by the first equalizer circuit and a second gain provided by the second equalizer circuit. In some instances, the gain configured for the receiving circuit may be expressed in a binary control input to the receiving circuit. The first gain may be configured based on even bits in the binary control signal and the second gain may be configured based on odd bits in the binary control signal. In some instances, the gain configured for the receiving circuit is expressed in a multi-digit word, and the feedback resistors in each of the TIAs are selected based on values of a number of bits in the multi-digit word.

In certain examples, the source degeneration circuit in the first equalizer circuit may be configured to equalize lower frequencies attenuation than the source degeneration circuit in the second equalizer circuit.

In various examples, the TIA includes at least one feedback poly-resistor coupled in parallel with a PMOS resistor. The receiving circuit may include a calibration TIA. The calibration TIA may have a first input coupled to a first output through one or more configurable poly-resistors, and a second input coupled to a second output through a PMOS transistor. In some implementations the calibration TIA has a feedback circuit configured to control a voltage applied to a gate of the PMOS transistor such that channel resistance of the PMOS transistor matches a resistance provided by the one or more configurable poly-resistors. The resistance provided by the one or more configurable poly-resistors may be configured based on content of a multi-digit control word provided to the feedback circuit. In some implementations the calibration TIA has a feedback circuit that includes a voltage comparator having one input coupled to a source of the PMOS transistor and a second input coupled that has a voltage level controlled by the one or more configurable poly-resistors. An output of the voltage comparator may be coupled to a gate of the PMOS transistor. The voltage applied to a gate of the PMOS transistor may be to a gate of the PMOS resistors in the TIAs to select the channel resistance of the PMOS resistors.

Some implementation examples are described in the following numbered clauses:

1. A receiving circuit, comprising: a first equalizer circuit including: a first stage having a source degeneration circuit that comprises a source degeneration resistor coupled in parallel with a source degeneration capacitor; and a trans-impedance amplifier (TIA) comprising feedback resistors, each feedback resistor being coupled between an input and an output of the TIA.
2. The receiving circuit as described in clause 1, further comprising: a second equalizer circuit coupled in series with the first equalizer circuit including: a first stage having a source degeneration circuit that comprises a source degeneration resistor coupled in parallel with a source degeneration capacitor; and a TIA comprising feedback resistors, each feedback resistor being coupled between an input and an output of the TIA in the second equalizer circuit.
3. The receiving circuit as described in clause 2, wherein a gain configured for the receiving circuit is provided as a combination of a first gain provided by the first equalizer circuit and a second gain provided by the second equalizer circuit.
4. The receiving circuit as described in clause 3, wherein the gain configured for the receiving circuit is expressed in a binary control input to the receiving circuit, wherein the first gain is configured based on even bits in the binary control signal and wherein the second gain is configured based on odd bits in the binary control signal.
5. The receiving circuit as described in clause 3 or clause 4, wherein the gain configured for the receiving circuit is expressed in a multi-digit word, and wherein the feedback resistors in each of the TIAs are selected based on values of a number of bits in the multi-digit word.
6. The receiving circuit as described in any of clauses 2-6, wherein the source degeneration circuit in the first equalizer circuit is configured to equalize lower frequencies attenuation than the source degeneration circuit in the second equalizer circuit.
7. The receiving circuit as described in any of clauses 1-6, wherein the TIA comprises at least one feedback poly-resistor coupled in parallel with a P-channel metal-oxide-semiconductor (PMOS) resistor.
8. The receiving circuit as described in clause 7, further comprising: a calibration TIA including: a first input coupled to a first output through one or more configurable poly-resistors; and a second input coupled to a second output through a PMOS transistor.
9. The receiving circuit as described in clause 8, wherein the calibration TIA further comprises: a feedback circuit configured to control a voltage applied to a gate of the PMOS transistor such that channel resistance of the PMOS transistor matches a resistance provided by the one or more configurable poly-resistors, wherein the resistance provided by the one or more configurable poly-resistors is configured based on content of a multi-digit control word provided to the feedback circuit.
10. The receiving circuit as described in clause 8 or clause 9, wherein the calibration TIA further comprises: a feedback circuit that includes a voltage comparator having one input coupled to a source of the PMOS transistor and a second input coupled to a node that has a voltage level controlled by the one or more configurable poly-resistors, wherein an output of the voltage comparator is coupled to a gate of the PMOS transistor.
11. The receiving circuit as described in any of clauses 8-10, wherein the voltage applied to a gate of the PMOS transistor is provided to a gate of the PMOS resistors in the each TIA.
12. An apparatus, comprising: means for equalizing a signal received from a communication channel, including a first equalizer circuit that includes a first stage having a source degeneration circuit configured to apply a first equalizing gain to the signal; means for applying a gain to the signal received from the communication channel, including a trans-impedance amplifier (TIA) in the first equalizer circuit; and means for selecting a gain to be applied to the signal received from the communication channel, including feedback resistors in the TIA that have configurable resistance values, each feedback resistor being coupled between an input of the TIA and an output of the TIA.
13. The apparatus as described in clause 12, wherein the means for equalizing the signal received from the communication channel further includes a second equalizer circuit having a first stage that includes a source degeneration circuit configured to apply a second equalizing gain to the signal received from the communication channel, and wherein the means for applying the gain to the signal received from the communication channel comprises a TIA in the second equalizer circuit.
14. The apparatus as described in clause 13, wherein the gain to be applied to the signal received from the communication channel includes a combination of a first gain provided by the first equalizer circuit and a second gain provided by the second equalizer circuit.
15. The apparatus as described in clause 14, wherein the means for selecting a gain to be applied to the signal received from the communication channel is configured to: configure the resistance values of the feedback resistors in the TIA in the first equalizer circuit using even bits in a binary control signal; and configuring resistance values of feedback resistors in the TIA in the second equalizer circuit using odd bits in the binary control signal.
16. The apparatus as described in any of clauses 12-15, wherein the TIA comprises at least one feedback poly-resistor coupled in parallel with a P-channel metal-oxide-semiconductor (PMOS) resistor.
17. The apparatus as described in clause 16, further comprising: a feedback circuit in a calibration TIA operable to match a resistance of the at least one feedback poly-resistor to a channel resistance of a PMOS transistor.
18. The apparatus as described in clause 16 or clause 17, wherein a gate control signal applied to the PMOS transistor is coupled to a gate of the PMOS resistor.
19. A method for equalizing a signal received from a communication channel, comprising: providing the signal to a first stage of a first equalizer circuit, the first stage of the first equalizer circuit having a source degeneration circuit configured to apply a first equalizing gain to the signal; coupling an output of the first stage of the first equalizer circuit to a trans-impedance amplifier (TIA) in the first equalizer circuit; and configuring resistance values of feedback resistors in the TIA to select a gain to be applied to the output of the first stage of the first equalizer circuit, each feedback resistor being coupled between an input of the TIA and an output of the TIA.
20. The method as described in clause 19, further comprising: coupling an output of the first equalizer circuit to a first stage of a second equalizer circuit, the first stage of the second equalizer circuit having a source degeneration circuit configured to apply a second equalizing gain to the output of the first equalizer circuit; coupling an output of the first stage of the second equalizer circuit to a TIA in the second equalizer circuit; and configuring resistance values of feedback resistors in the TIA in the second equalizer circuit to select a gain to be applied to the output of the first stage of the second equalizer circuit, each feedback resistor being coupled between an input and an output of the TIA in the second equalizer circuit.
21. The method as described in clause 20, wherein a desired gain is obtained as a combination of a first gain provided by the first equalizer circuit and a second gain provided by the second equalizer circuit.
22. The method as described in clause 20 or clause 21, further comprising: configuring the resistance values of the feedback resistors in the TIA in the first equalizer circuit using even bits in a binary control signal; and configuring the resistance values of the feedback resistors in the TIA in the second equalizer circuit using odd bits in the binary control signal.
23. The method as described in any of clauses 20-22, further comprising: selecting the resistance values of the feedback resistors in each TIA based on values of a number of bits in a multi-digit word.
24. The method as described in any of clauses 20-23, further comprising: configuring the source degeneration circuit in the first equalizer circuit to equalize a first band of frequencies; and configuring the source degeneration circuit in the second equalizer circuit to equalize a second band of frequencies different from the first band of frequencies.
25. The method as described in any of clauses 19-24, wherein the TIA comprises at least one feedback poly-resistor coupled in parallel with a P-channel metal-oxide-semiconductor (PMOS) resistor.
26. The method as described in clause 25, further comprising: using a feedback circuit in a calibration TIA to match a resistance of the at least one feedback poly-resistor to a channel resistance of a PMOS transistor.
27. The method as described in clause 26, further comprising: coupling a gate control signal applied to the PMOS transistor to a gate of the PMOS resistor.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A receiving circuit, comprising:
a first equalizer circuit including:
  a first source degeneration circuit that comprises a first source degeneration resistor coupled in parallel with a first source degeneration capacitor; and
  a first trans-impedance amplifier (TIA) comprising a first variable feedback resistor that is coupled between a first input of the first TIA and a first output of the first TIA and a second variable feedback resistor that is coupled between a second input of the first TIA and a second output of the first TIA,
wherein the first variable feedback resistor and the second variable feedback resistor are configured to control a first gain that is provided by the first equalizer circuit, and
wherein resistance values of the first variable feedback resistor and the second variable feedback resistor are controlled by a first control input received at the first equalizer circuit.

2. The receiving circuit of claim 1, further comprising:
a second equalizer circuit coupled in series with the first equalizer circuit including:
  a second source degeneration circuit that comprises a second source degeneration resistor coupled in parallel with a second source degeneration capacitor; and
  a second TIA comprising a third variable feedback resistor that is coupled between a first input of the second TIA and a first output of the second TIA and a fourth variable feedback resistor that is coupled between a second input of the second TIA and a second output of the second TIA,
wherein the third variable feedback resistor and the fourth variable feedback resistor are configured to control a second gain that is provided by the second equalizer circuit, and
wherein resistance values of the third variable feedback resistor and the fourth variable feedback resistor are controlled by a second control input received at the second equalizer circuit.

3. The receiving circuit of claim 2, wherein the source degeneration circuit in the first equalizer circuit is configured to equalize lower frequencies attenuation than the source degeneration circuit in the second equalizer circuit.

4. The receiving circuit of claim 2, wherein a gain configured for the receiving circuit is provided as a combination of the first gain and the second gain.

5. The receiving circuit of claim 4, wherein the gain configured for the receiving circuit is expressed in a binary coded input received by the receiving circuit, wherein the first gain is configured based on even bits in the binary coded input and wherein the second gain is configured based on odd bits in the binary coded input.

6. The receiving circuit of claim 4, wherein the gain configured for the receiving circuit is expressed in a multi-digit word, and wherein each of the first, second, third and fourth variable feedback resistors has a resistance value that is selected based on a value of a corresponding number of bits in the multi-digit word.

7. The receiving circuit of claim 1, wherein the first variable feedback resistor comprises at least one feedback poly-resistor that is coupled in parallel with a first P-channel metal-oxide-semiconductor (PMOS) resistor, and wherein the second variable feedback resistor comprises at least one feedback poly-resistor that is coupled in parallel with a second PMOS resistor.

8. The receiving circuit of claim 7, further comprising:
a calibration TIA comprising:
a first input of the calibration TIA that is coupled to a first output of the calibration TIA through one or more configurable poly-resistors; and
a second input of the calibration TIA that is coupled to a second output of the calibration TIA through a PMOS transistor that is configured as a third PMOS resistor.

9. The receiving circuit of claim 8, wherein the calibration TIA further comprises:
a feedback circuit configured to control a voltage applied to a gate of the PMOS transistor such that channel resistance of the PMOS transistor matches a resistance provided by the one or more configurable poly-resistors, wherein the resistance provided by the one or more configurable poly-resistors is configured based on content of a multi-digit control word provided to the feedback circuit.

10. The receiving circuit of claim 8, wherein the calibration TIA further comprises:
a feedback circuit that includes a voltage comparator having one input coupled to a source of the PMOS transistor and a second input coupled to a node that has a voltage level controlled by the one or more configurable poly-resistors, wherein an output of the voltage comparator is coupled to a gate of the PMOS transistor.

11. The receiving circuit of claim 8, wherein each of the first and second PMOS resistors is implemented using a gate-controlled transistor, and wherein a voltage applied to the gate of the PMOS transistor is used to control each of the gate-controlled transistors.

12. An apparatus, comprising:
means for equalizing a signal received from a communication channel, including a first equalizer circuit that includes a first source degeneration circuit that has a first source degeneration resistor coupled in parallel with a first source degeneration capacitor; and
means for applying a gain to the signal received from the communication channel, including a first trans-impedance amplifier (TIA) in the first equalizer circuit, wherein the first TIA includes a first variable feedback resistor that is coupled between a first input of the first TIA and a first output of the first TIA and a second variable feedback resistor that is coupled between a second input of the first TIA and a second output of the first TIA,
wherein the first variable feedback resistor and the second variable feedback resistor are configured to control a first gain that is provided by the first equalizer circuit, and
wherein resistance values of the first variable feedback resistor and the second variable feedback resistor are controlled by a first control input received at the first equalizer circuit.

13. The apparatus of claim 12, wherein the means for equalizing the signal received from the communication channel further includes a second equalizer circuit having a second source degeneration circuit that comprises a second source degeneration resistor coupled in parallel with a second source degeneration capacitor,
wherein the means for applying the gain to the signal received from the communication channel comprises a second TIA in the second equalizer circuit, wherein the second TIA includes a third variable feedback resistor that is coupled between a first input of the second TIA and a first output of the second TIA and a fourth variable feedback resistor that is coupled between a second input of the second TIA and a second output of the second TIA,
wherein the third variable feedback resistor and the fourth variable feedback resistor are configured to control a second gain that is provided by the second equalizer circuit, and
wherein resistance values of the third variable feedback resistor and the fourth variable feedback resistor are controlled by a second control input received at the first second equalizer circuit.

14. The apparatus of claim 13, wherein the gain to be applied to the signal received from the communication channel includes a combination of the first gain and the second gain.

15. The apparatus of claim 14, further comprising means for selecting the gain to be applied to the signal received from the communication channel including:
means for configuring the resistance values of the feedback resistors in the first TIA using even bits in a binary control signal; and
means for configuring the resistance values of the feedback resistors in the second TIA using odd bits in the binary control signal.

16. The apparatus of claim 12, wherein the first variable feedback resistor comprises at least one feedback poly-resistor that is coupled in parallel with a first P-channel metal-oxide-semiconductor (PMOS) resistor, and wherein the second variable feedback resistor comprises at least one feedback poly-resistor that is coupled in parallel with a second PMOS resistor.

17. The apparatus of claim 16, further comprising:
a calibration TIA that includes a feedback circuit configured to match a resistance of the at least one feedback poly-resistor to a channel resistance of a PMOS transistor in the calibration TIA.

18. The apparatus of claim 17, wherein each of the first and second PMOS resistors is implemented using a gate-controlled transistor, and wherein a voltage applied to the gate of the PMOS transistor is used to control each of the gate-controlled transistors.

19. A method for equalizing a signal received from a communication channel, comprising:
provyiding the signal to a first stage of a first equalizer circuit, the first stage of the first equalizer circuit having a source degeneration circuit that includes a first source degeneration resistor coupled in parallel with a first source degeneration capacitor;
coupling an output of the first stage of the first equalizer circuit to a first trans-impedance amplifier (TIA) in the first equalizer circuit, wherein the first TIA includes a first variable feedback resistor that is coupled between a first input of the first TIA and a first output of the first TIA and a second variable feedback resistor that is coupled between a second input of the first TIA and a second output of the first TIA; and
configuring resistance values of the first variable feedback resistor and the second variable feedback resistor to select a gain to be applied to the output of the first stage of the first equalizer circuit.

20. The method of claim 19, further comprising:
coupling the output of the first equalizer circuit to a first stage of a second equalizer circuit, the first stage of the second equalizer circuit including a second source degeneration circuit that has a second source degeneration resistor coupled in parallel with a second source degeneration capacitor;
coupling an output of the first stage of the second equalizer circuit to a second TIA that is provided in the second equalizer circuit, wherein the second TIA includes a third variable feedback resistor that is coupled between a first input of the second TIA and a first output of the second TIA and a fourth variable feedback resistor that is coupled between a second input of the second TIA and a second output of the second TIA; and
configuring resistance values of the third variable feedback resistor and the fourth variable feedback resistor to select a gain to be applied to the output of the first stage of the second equalizer circuit.

21. The method of claim 20, wherein a desired gain is obtained as a combination of a first gain provided by the first equalizer circuit and a second gain provided by the second equalizer circuit.

22. The method of claim 20, further comprising:
configuring the resistance values of the feedback resistors in the first TIA using even bits in a binary control signal; and
configuring the resistance values of the feedback resistors in the second TIA using odd bits in the binary control signal.

23. The method of claim 20, further comprising:
selecting the resistance values of the feedback resistors in each of the first TIA and the second TIA based on value of a corresponding number of bits in a multi-digit word.

24. The method of claim 20, further comprising:
configuring the first source degeneration circuit to equalize a first band of frequencies; and
configuring the second source degeneration circuit to equalize a second band of frequencies different from the first band of frequencies.

25. The method of claim 19, wherein the first variable feedback resistor comprises at least one feedback poly-resistor that is coupled in parallel with a first P-channel metal-oxide-semiconductor (PMOS) resistor, and wherein the second variable feedback resistor comprises at least one feedback poly-resistor that is coupled in parallel with a second PMOS resistor.

26. The method of claim 25, further comprising:
using a feedback circuit in a calibration TIA to match a resistance provided by one or more poly-resistors to a channel resistance of a PMOS transistor.

27. The method of claim 26, wherein each of the first and second PMOS resistors is implemented using a gate-controlled transistor, the method further comprising:
using a gate control signal applied to the PMOS transistor to control each of the gate-controlled transistors.

* * * * *